US012782426B2

(12) United States Patent
Ostrowski et al.

(10) Patent No.: US 12,782,426 B2
(45) Date of Patent: Nov. 3, 2026

(54) INTEGRATED HEATER AND TEMPERATURE MEASUREMENT

(71) Applicant: AEM Singapore Pte. Ltd., Singapore (SG)

(72) Inventors: Carl L. Ostrowski, Milford, MI (US); Terry Sinclair Connacher, Tempe, AZ (US)

(73) Assignee: AEM Singapore Pte. Ltd., Singapore (SG)

( * ) Notice: Subject to any disclaimer, the term of this patent is extended or adjusted under 35 U.S.C. 154(b) by 73 days.

(21) Appl. No.: 18/744,313

(22) Filed: Jun. 14, 2024

(65) Prior Publication Data

US 2024/0369621 A1 Nov. 7, 2024

Related U.S. Application Data

(63) Continuation of application No. 18/471,192, filed on Sep. 20, 2023, now Pat. No. 12,061,227, which is a (Continued)

(51) Int. Cl.
*G01R 31/28* (2006.01)

(52) U.S. Cl.
CPC ..... *G01R 31/2875* (2013.01); *G01R 31/2891* (2013.01)

(58) Field of Classification Search
CPC ............ G01R 31/2856; G01R 31/2875; G01R 31/2877
See application file for complete search history.

(56) References Cited

U.S. PATENT DOCUMENTS 5,280,422 A 1/1994 Moe et al.
5,325,052 A 6/1994 Yamashita
(Continued)

FOREIGN PATENT DOCUMENTS

EP 0947903 A1 10/1999
EP 2316286 A1 5/2011
(Continued)

OTHER PUBLICATIONS

Notice of Allowance mailed Dec. 5, 2024, for U.S. Appl. No. 18/642,142, filed Apr. 22, 2024, seven pages.
(Continued)

*Primary Examiner* — Tung X Nguyen
(74) *Attorney, Agent, or Firm* — Morrison & Foerster LLP

(57) ABSTRACT

Disclosed herein is an integrated heater and measurement (IHM) device comprising heating-sensing element(s) and heating-sensing circuit(s). A heating-sensing element generates heat and determines the temperature of the IHM device. In some embodiments, the heating-sensing element may operate in a plurality of modes: heating mode, sensing mode, and/or off mode. A controller may dynamically adjust the properties of the operation mode and/or time periods based on the determined temperature. The adjusted properties may include the duration of the heating mode, the ON time for a heating-sensing element, etc. The controller may adjust the duration of heating mode based on the temperature difference between the determined temperature and a set point temperature, such as decreasing the duration of the heating mode when there is a low temperature difference, and increasing the duration of the heating mode when there is a high temperature difference.

20 Claims, 9 Drawing Sheets

Related U.S. Application Data continuation of application No. 18/311,164, filed on May 2, 2023, now Pat. No. 11,828,796.

(56) References Cited

U.S. PATENT DOCUMENTS

| | | | | |
|---|---|---|---|---|
| 5,414,370 | A | 5/1995 | Hashinaga et al. | |
| 5,473,259 | A | 12/1995 | Takeda | |
| 5,521,850 | A | 5/1996 | Moe et al. | |
| 5,977,785 | A | 11/1999 | Burward-Hoy | |
| 6,080,970 | A * | 6/2000 | Yoshida | C23C 14/541 118/725 |
| 6,084,221 | A * | 7/2000 | Natsuhara | H05B 3/265 399/329 |
| 6,225,608 | B1 | 5/2001 | Kaellgren | |
| 6,389,225 | B1 | 5/2002 | Malinoski et al. | |
| 6,423,949 | B1 * | 7/2002 | Chen | H01L 21/67103 118/725 |
| 6,498,899 | B2 | 12/2002 | Malinoski et al. | |
| 6,549,026 | B1 | 4/2003 | Dibattista et al. | |
| 6,583,638 | B2 | 6/2003 | Costello et al. | |
| 6,617,868 | B1 | 9/2003 | Needham | |
| 6,668,570 | B2 | 12/2003 | Wall et al. | |
| 6,711,904 | B1 | 3/2004 | Law et al. | |
| 6,774,661 | B1 | 8/2004 | Tustaniwskyj et al. | |
| 6,825,681 | B2 | 11/2004 | Feder et al. | |
| 6,862,405 | B2 | 3/2005 | Malinoski et al. | |
| 6,985,000 | B2 | 1/2006 | Feder et al. | |
| 6,992,500 | B2 | 1/2006 | Sugiyama et al. | |
| 7,042,240 | B2 | 5/2006 | Lopez et al. | |
| 7,064,953 | B2 | 6/2006 | Miller | |
| 7,196,295 | B2 | 3/2007 | Fennewald et al. | |
| 7,311,782 | B2 | 12/2007 | Strang et al. | |
| 7,355,428 | B2 | 4/2008 | Kabbani et al. | |
| 7,436,059 | B1 | 10/2008 | Ouyang | |
| 7,601,935 | B2 | 10/2009 | Fennewald et al. | |
| 7,626,407 | B2 | 12/2009 | Kabbani | |
| 7,663,388 | B2 | 2/2010 | Barabi et al. | |
| 7,963,119 | B2 | 6/2011 | Campbell | |
| 8,274,300 | B2 | 9/2012 | Sakaue et al. | |
| 8,289,040 | B2 | 10/2012 | Komoto et al. | |
| 8,343,280 | B2 | 1/2013 | Iimuro | |
| 8,508,245 | B1 | 8/2013 | Barabi et al. | |
| 8,680,443 | B2 | 3/2014 | Mcmillin et al. | |
| 8,772,682 | B2 | 7/2014 | Ambal et al. | |
| 8,891,235 | B2 | 11/2014 | Walczyk et al. | |
| 8,896,335 | B2 | 11/2014 | Stuckey et al. | |
| 8,927,907 | B2 | 1/2015 | Fink et al. | |
| 9,046,569 | B2 | 6/2015 | Kirby et al. | |
| 9,291,667 | B2 | 3/2016 | Armstrong et al. | |
| 9,307,578 | B2 | 4/2016 | Pease | |
| 9,347,987 | B2 | 5/2016 | Schroeder et al. | |
| 9,360,502 | B2 | 6/2016 | Crippen et al. | |
| 9,362,148 | B2 * | 6/2016 | Willwerth | H01J 37/321 |
| 9,377,486 | B2 | 6/2016 | Song et al. | |
| 9,400,291 | B2 | 7/2016 | Johnson et al. | |
| 9,494,353 | B2 | 11/2016 | Yu et al. | |
| 9,588,142 | B2 | 3/2017 | Kiyokawa et al. | |
| 9,709,622 | B2 | 7/2017 | Lopez et al. | |
| 9,713,345 | B2 | 7/2017 | Farine et al. | |
| 9,869,714 | B2 | 1/2018 | Johnson et al. | |
| 10,056,225 | B2 | 8/2018 | Gaff et al. | |
| 10,104,718 | B2 | 10/2018 | Wallinger | |
| 10,760,465 | B2 | 9/2020 | Everly et al. | |
| 10,934,921 | B2 | 3/2021 | Culbertson et al. | |
| 11,039,528 | B2 | 6/2021 | Tustaniwskyj et al. | |
| 11,226,362 | B2 | 1/2022 | Tsai et al. | |
| 11,237,031 | B2 | 2/2022 | Wigen et al. | |
| 11,340,283 | B2 | 5/2022 | Kasai et al. | |
| 11,382,182 | B2 | 7/2022 | Holoubek et al. | |
| 11,454,666 | B2 | 9/2022 | Chan et al. | |
| 11,493,551 | B2 | 11/2022 | Ranganathan et al. | |
| 11,567,119 | B2 | 1/2023 | Kabbani et al. | |
| 11,592,472 | B2 | 2/2023 | Walczyk et al. | |
| 11,656,272 | B1 | 5/2023 | Jones et al. | |
| 11,674,999 | B2 | 6/2023 | Kabbani et al. | |
| 11,693,051 | B1 | 7/2023 | Jones et al. | |
| 11,796,589 | B1 | 10/2023 | Jones et al. | |
| 11,828,795 | B1 | 11/2023 | Jones et al. | |
| 11,828,796 | B1 | 11/2023 | Ostrowski et al. | |
| 11,835,549 | B2 | 12/2023 | Cruzan | |
| 11,852,678 | B2 | 12/2023 | Ranganathan | |
| 11,990,386 | B2 | 5/2024 | Iyengar et al. | |
| 12,000,885 | B1 | 6/2024 | Kabbani | |
| 12,013,432 | B1 | 6/2024 | Ostrowski et al. | |
| 12,061,227 | B1 | 8/2024 | Ostrowski | |
| 12,085,609 | B1 | 9/2024 | Ostrowski | |
| 12,259,427 | B2 | 3/2025 | Jones et al. | |
| 12,259,428 | B1 | 3/2025 | Kabbani et al. | |
| 2002/0118032 | A1 | 8/2002 | Norris et al. | |
| 2003/0155939 | A1 | 8/2003 | Lutz et al. | |
| 2005/0151553 | A1 | 7/2005 | Kabbani et al. | |
| 2005/0224492 | A1 | 10/2005 | Roy | |
| 2006/0164111 | A1 | 7/2006 | Lopez et al. | |
| 2007/0138166 | A1 | 6/2007 | Fennewald et al. | |
| 2008/0042667 | A1 | 2/2008 | Yamashita et al. | |
| 2008/0191729 | A1 | 8/2008 | Blanco | |
| 2009/0039073 | A1 | 2/2009 | Guo et al. | |
| 2009/0265045 | A1 | 10/2009 | Coxe, III | |
| 2010/0042355 | A1 | 2/2010 | Aube et al. | |
| 2010/0086991 | A1 | 4/2010 | Fish | |
| 2011/0022324 | A1 | 1/2011 | Knopp et al. | |
| 2011/0095777 | A1 | 4/2011 | Komoto | |
| 2011/0132000 | A1 | 6/2011 | Deane et al. | |
| 2012/0049874 | A1 | 3/2012 | Lacroix | |
| 2012/0292305 | A1 | 11/2012 | Ambal et al. | |
| 2012/0292308 | A1 | 11/2012 | Fennewald et al. | |
| 2013/0285686 | A1 | 10/2013 | Malik et al. | |
| 2014/0139246 | A1 | 5/2014 | Chuang et al. | |
| 2014/0262129 | A1 | 9/2014 | Li et al. | |
| 2016/0161343 | A1 * | 6/2016 | Smith | G01K 7/16 374/185 |
| 2016/0313390 | A1 | 10/2016 | Barabi et al. | |
| 2017/0027084 | A1 | 1/2017 | Kabbani et al. | |
| 2017/0100894 | A1 | 4/2017 | Burns | |
| 2018/0106686 | A1 | 4/2018 | Furtner et al. | |
| 2018/0196084 | A1 | 7/2018 | Tustaniwskyj | |
| 2018/0203476 | A1 | 7/2018 | Oyama | |
| 2019/0086468 | A1 | 3/2019 | Yoshino | |
| 2019/0385925 | A1 | 12/2019 | Walczyk et al. | |
| 2019/0391335 | A1 | 12/2019 | Tan | |
| 2020/0092951 | A1 | 3/2020 | Fennewald et al. | |
| 2020/0203240 | A1 | 6/2020 | Haehn | |
| 2020/0284180 | A1 | 9/2020 | Everly et al. | |
| 2020/0329533 | A1 | 10/2020 | Wallinger et al. | |
| 2020/0411408 | A1 | 12/2020 | Walczyk et al. | |
| 2021/0033666 | A1 | 2/2021 | Kasai | |
| 2021/0037676 | A1 | 2/2021 | Malouin | |
| 2021/0263542 | A1 | 8/2021 | Breitlow et al. | |
| 2021/0302501 | A1 | 9/2021 | Su | |
| 2021/0325453 | A1 | 10/2021 | Chan et al. | |
| 2022/0026485 | A1 | 1/2022 | Kim | |
| 2022/0053609 | A1 | 2/2022 | Phillips | |
| 2022/0107360 | A1 | 4/2022 | Kabbani et al. | |
| 2022/0137092 | A1 | 5/2022 | Ranganathan et al. | |
| 2022/0137129 | A1 | 5/2022 | Ranganathan et al. | |
| 2022/0155364 | A1 | 5/2022 | Kabbani et al. | |
| 2022/0155384 | A1 | 5/2022 | Lovati | |
| 2022/0172925 | A1 | 6/2022 | Jing et al. | |
| 2022/0178991 | A1 | 6/2022 | Kabbani et al. | |
| 2022/0187361 | A1 | 6/2022 | Kabbani et al. | |
| 2022/0196728 | A1 | 6/2022 | Mamchik et al. | |
| 2022/0206060 | A1 | 6/2022 | Tustaniwskyj | |
| 2022/0206061 | A1 | 6/2022 | Ranganathan et al. | |
| 2022/0221509 | A1 | 7/2022 | Kasai | |
| 2022/0276301 | A1 | 9/2022 | Kabbani et al. | |
| 2022/0284982 | A1 | 9/2022 | Ranganathan et al. | |
| 2024/0079839 | A1 | 3/2024 | Green | |
| 2024/0230752 | A9 | 7/2024 | Jones | |
| 2024/0329120 | A1 | 10/2024 | Jones | |
| 2025/0067797 | A1 | 2/2025 | Ostrowski et al. | |

(56) References Cited

U.S. PATENT DOCUMENTS

| | | | |
|---|---|---|---|
| 2025/0244380 | A1 | 7/2025 | Kabbani et al. |
| 2026/0009842 | A1 | 1/2026 | Kabbani |

FOREIGN PATENT DOCUMENTS

| | | | |
|---|---|---|---|
| JP | 2001210683 | A | 8/2001 |
| TW | 201615526 | A | 5/2016 |
| TW | 201730572 | A | 9/2017 |
| TW | 202109227 | A | 3/2021 |
| TW | 1784539 | B | 11/2022 |
| WO | 2022053782 | A1 | 3/2022 |
| WO | 2024084300 | A1 | 4/2024 |
| WO | 2025040957 | A1 | 2/2025 |
| WO | 2025133714 | A1 | 6/2025 |
| WO | 2026013546 | A1 | 1/2026 |

OTHER PUBLICATIONS

Taiwanese Office Action dated Aug. 16, 2024, for TW Patent Application No. 112131863, with English translation, 13 pages.
Taiwanese Office Action dated Nov. 11, 2024, for TW Patent Application No. 112133583, with English translation, 8 pages.
Taiwanese Office Action dated Aug. 12, 2025, for TW Patent Application No. 114117836, with English translation, 12 pages.
Final Office Action mailed Jan. 8, 2024, for U.S. Appl. No. 18/455,070, filed Aug. 24, 2023, fourteen pages.
Final Office Action mailed Jun. 26, 2024, for U.S. Appl. No. 18/390,935, filed Dec. 20, 2023, twenty-five pages.
Final Office Action mailed Jun. 27, 2024, for U.S. Appl. No. 18/390,951, filed Dec. 20, 2023, nineteen pages.
International Search Report and Written Opinion mailed Feb. 9, 2024, for PCT Application No. PCT/ IB2023/058414, filed Aug. 24, 2023, ten pages.
Non-Final Office Action mailed Dec. 7, 2023, for U.S. Appl. No. 18/471,192, filed Sep. 20, 2023, six pages.
Non-Final Office Action mailed Jan. 13, 2023, for U.S. Appl. No. 18/048,836, filed Oct. 21, 2022, ten pages.
Non-Final Office Action mailed Jun. 26, 2024, for U.S. Appl. No. 18/455,070, filed Aug. 24, 2023, twelve pages.
Non-Final Office Action mailed Mar. 20, 2023, for U.S. Appl. No. 18/048,833, filed Oct. 21, 2022, fifteen pages.
Non-Final Office Action mailed Mar. 22, 2024, for U.S. Appl. No. 18/390,935, filed Dec. 20, 2023, twenty pages.
Non-Final Office Action mailed Mar. 8, 2024, for U.S. Appl. No. 18/390,951, filed Dec. 20, 2023, seventeen pages.
Non-Final Office Action mailed Nov. 24, 2023, for U.S. Appl. No. 18/454,741, filed Aug. 23, 2023, six pages.
Non-Final Office Action mailed Nov. 8, 2023, for U.S. Appl. No. 18/454,737, filed Aug. 23, 2023, six pages.
Non-Final Office Action mailed Sep. 28, 2023, for U.S. Appl. No. 18/455,070, filed Aug. 24, 2023, eleven pages.
Notice of Allowance (corrected) mailed Aug. 31, 2023, for U.S. Appl. No. 18/311,164, filed May 2, 2023, four pages.
Notice of Allowance (corrected) mailed Jun. 16, 2023, for U.S. Appl. No. 18/048,833, filed Oct. 21, 2022, three pages.
Notice of Allowance (corrected) mailed Mar. 8, 2023, for U.S. Appl. No. 18/048,831, filed Oct. 21, 2022, five pages.
Notice of Allowance mailed Apr. 1, 2024, for U.S. Appl. No. 18/390,918, filed Dec. 20, 2023, seven pages.
Notice of Allowance mailed Apr. 10, 2023, for U.S. Appl. No. 18/048,836, filed Oct. 21, 2022, eight pages.
Notice of Allowance mailed Apr. 15, 2024, for U.S. Appl. No. 18/455,070, filed Aug. 24, 2023, eight pages.
Notice of Allowance mailed Apr. 24, 2024, for U.S. Appl. No. 18/455,070, filed Aug. 24, 2023, six pages.
Notice of Allowance mailed Apr. 4, 2024, for U.S. Appl. No. 18/471,192, filed Sep. 20, 2023, seven pages.
Notice of Allowance mailed Aug. 16, 2023, for U.S. Appl. No. 18/311,164, filed May 2, 2023, seven pages.
Notice of Allowance mailed Feb. 16, 2024, for U.S. Appl. No. 18/454,737, filed Aug. 23, 2023, seven pages.
Notice of Allowance mailed Jan. 31, 2023, for U.S. Appl. No. 18/048,831, filed Oct. 21, 2022, eight pages.
Notice of Allowance mailed Jul. 11, 2023, for U.S. Appl. No. 18/311,164, filed May 2, 2023, eight pages.
Notice of Allowance mailed Jul. 21, 2023, for U.S. Appl. No. 17/971,505, filed Oct. 21, 2022, seven pages.
Notice of Allowance mailed Jun. 1, 2023, for U.S. Appl. No. 18/048,833, filed Oct. 21, 2022, seven pages.
Notice of Allowance mailed Jun. 5, 2023, for U.S. Appl. No. 17/971,505, filed Oct. 21, 2022, seven pages.
Notice of Allowance mailed Mar. 1, 2024, for U.S. Appl. No. 18/454,741, filed Aug. 23, 2023, seven pages.
Notice of Allowance mailed May 2, 2023, for U.S. Appl. No. 18/048,831, filed Oct. 21, 2022, seven pages.
Notice of Allowance mailed May 30, 2024, for U.S. Appl. No. 18/471,192, filed Sep. 20, 2023, seven pages.
Notice of Allowance mailed May 8, 2024, for U.S. Appl. No. 18/454,737, filed Aug. 23, 2023, seven pages.
Notice of Allowance mailed May 8, 2024, for U.S. Appl. No. 18/454,741, filed Aug. 23, 2023, seven pages.
International Preliminary Report and Written Opinion mailed Nov. 13, 2025, for PCT Application No. PCT/IB2023058785, filed Sep. 5, 2023, 7 pages.
Taiwanese Notice of Allowance dated Feb. 13, 2025, for TW Patent Application No. 112131863, with English translation, 8 pages.
Taiwanese Notice of Allowance mailed Mar. 3, 2025, for TW Patent Application No. 112133583, with English translation, 8 pages.
Notice of Allowance mailed Jan. 23, 2025, for U.S. Appl. No. 18/455,070, filed Aug. 24, 2023, nine pages.
International Preliminary Report and Written Opinion mailed May 1, 2025, for PCT Application No. PCT/IB2023/058414, filed Aug. 24, 2023, eight pages.
Non-Final Office Action mailed May 18, 2026, for U.S. Appl. No. 18/766,419, filed Jul. 8, 2024, fifteen pages.
Non-Final Office Action mailed Apr. 15, 2026, for U.S. Appl. No. 19/431,636, filed Dec. 23, 2025, ten pages.
Non-Final Office Action mailed Mar. 31, 2026, for U.S. Appl. No. 18/797,339, filed Aug. 7, 2024, ten pages.
International Preliminary Report and Written Opinion mailed Mar. 5, 2026, for PCT Application No. PCT/IB2024/053062, filed Mar. 28, 2024, 7 pages.
Non-Final Office Action mailed Dec. 30, 2025, for U.S. Appl. No. 18/733,755, filed Jun. 4, 2024, 11 pages.

* cited by examiner

INTEGRATED HEATER AND TEMPERATURE MEASUREMENT

CROSS-REFERENCE TO RELATED APPLICATIONS

This application is a continuation of U.S. Non-Provisional application Ser. No. 18/471,192, filed Sep. 20, 2023, which is a continuation of U.S. Non-Provisional application Ser. No. 18/311,164, filed May 2, 2023 (now U.S. Pat. No. 11,828,796, issued Nov. 28, 2023), which is incorporated herein by reference in its entirety.

FIELD

The present disclosure relates to heating and temperature measurement systems for electrical testing of integrated circuit devices.

BACKGROUND

Testing of integrated circuit (IC) devices comprises heating the devices using heaters so that they are at a set point temperature while under test. In some instances, it is desirable to accurately measure the temperature of the heater. The measured temperature is used for actively controlling the heater. An incorrect measurement of the heater temperature may lead to an incorrect IC temperature, which can cause the performance of the device under test (DUT) to deviate or fail prematurely. In some instances, the temperature sensor used to measure the heater temperature is a separate component placed in close proximity to the heater. However, there are several disadvantages when the temperature sensor is separate from the heater. A separate temperature sensor may not be able to accurately measure the heater temperature. This incorrect measurement may be due to the separate temperature sensor not being close enough to the heater resulting in, e.g., unwanted delays between any change in heater temperature and measured temperature. This unwanted delay is due to the heat having to transfer over a path from the heater to the sensor. This unwanted delay is also due to the thermal mass of the separate temperature sensor adding a lag between the actual temperature and what is measured. Additionally, a separate temperature sensor may complicate the physical design and layout of the test system, requiring extra circuitry such as dedicated temperature sensing traces and I/O pins, especially in test systems that use a plurality of heaters and temperature sensors. Furthermore, a separate temperature sensor can create additional failure modes. For example, a failure in the temperature sensor may not be recognized as a failure, and corrective actions may not be taken to adjust the output of the heater. What is a needed is an integrated heater and temperature sensor that does not have these disadvantages.

SUMMARY

Disclosed herein is an integrated heater and measurement (IHM) device comprising one or more heating-sensing elements. A heating-sensing element may be configured to both generate heat and determine the temperature of the IHM device, leading to an IHM device that is simpler, has better manufacturing yield, is smaller, and has fewer number of pins than a heater. In some embodiments, the heating-sensing element may operate in a plurality of modes: heating mode, sensing mode, and/or off mode. A controller may dynamically adjust the properties of heating-sensing elements based on the determined temperature. The adjusted properties may include the duration of the heating mode, the ON time for a heating-sensing element, etc. This dynamic adjustment of the properties may allow the IHM device to heat up a device under test more quickly than a heater. In some embodiments, the IHM comprises one or more heating-sensing circuits for controlling operation of the heating-sensing element(s) such as providing power to the heating-sensing element(s) and determining voltage drops across the heating-sensing element(s).

A method for controlling a temperature of a device under test is disclosed. The method comprises: during a heating mode of a heating-sensing element: sending, using a controller, one or more control signals to a drive voltage circuit, and generating, using the drive voltage circuit, power provided to the heating-sensing element; and during a sensing mode of the heating-sensing element: sending, using a current circuit, a current to the heating-sensing element, determining, using a sense circuit, a voltage drop across the heating-sensing element, and determining, using the controller, the temperature of the device under test based on the current and the voltage drop, wherein the heating-sensing element is operated in the heating mode and the sensing mode during different portions of a time period. Additionally or alternatively, in some embodiments, determining the temperature of the device under test comprises: determining a resistance of the heating-sensing element based on the current and the voltage drop, wherein the temperature of the device under test is related to the determined resistance. Additionally or alternatively, in some embodiments, a duration of the heating mode varies dynamically based on a difference between the determined temperature and a set point temperature. Additionally or alternatively, in some embodiments, a duration of the sensing mode is pre-determined. Additionally or alternatively, in some embodiments, the heating-sensing element is operated in an off mode during a portion of the time period. Additionally or alternatively, in some embodiments, the method further comprises: dynamically adjusting properties of the heating mode based on the determined temperature. Additionally or alternatively, in some embodiments, adjusting the properties of the heating mode comprises: decreasing a duration of the heating mode for a low temperature difference between the determined temperature and a set point temperature; increasing the duration of the heating mode for a high temperature difference between the determined temperature and the set point temperature; or maintaining the duration of the heating mode for a zero temperature difference between the determined temperature and the set point temperature. Additionally or alternatively, in some embodiments, the time period is 200 μs. Additionally or alternatively, in some embodiments, the heating-sensing element is included in a plurality of heating-sensing elements of an integrated heater and temperature measurement device, wherein the plurality of heating-sensing elements operate in the sensing mode at the same time. Additionally or alternatively, in some embodiments, the heating-sensing element is included in a plurality of heating-sensing elements of an integrated heater and temperature measurement device, wherein the plurality of heating-sensing elements operate in an off mode at the same time. Additionally or alternatively, in some embodiments, the method further comprises: determining whether one or more criteria have been met, wherein the one or more criteria comprise: the determined temperature of the device under test being greater than a temperature threshold, a power of the device under test being greater than a power threshold, the heating-sensing element being shorted, or the heating-sensing element being an open circuit. Additionally or alternatively, in some embodiments, the method further comprises: in accordance with meeting the one or more criteria, during the heating mode of the heating-sensing element, preventing the drive voltage circuit from providing power to the heating-sensing element.

An integrated heater and temperature measurement device is disclosed. The integrated heater and temperature measurement device comprises: one or more heating-sensing elements configured to operate in a heating mode and a sensing mode during different portions of a time period; and one or more heating-sensing circuits, wherein at least one of the one or more heating-sensing circuits comprises: a drive voltage circuit configured to provide power to the one or more heating-sensing elements to generate heat during the heating mode; a current circuit configured to send a current to a corresponding heating-sensing element during the sensing mode; a sense voltage circuit configured to determine a voltage drop across the corresponding heating-sensing element; and a controller configured to determine a temperature of the corresponding heating-sensing element based on the voltage drop. Additionally or alternatively, in some embodiments, the integrated heater and temperature measurement device further comprises: one or more sets of pins coupled to the one or more heating-sensing elements, wherein a number of the one or more sets of pins is equal to a number of the one or more heating-sensing elements. Additionally or alternatively, in some embodiments, the integrated heater and temperature measurement device further comprises: a first layer of insulating material, wherein the at least one heating-sensing element is disposed on the first layer of insulating material; a second layer of insulating material disposed on the at least one heating-sensing element; a shield disposed on the second layer of insulating material; and a third layer of insulating material disposed on the shield. Additionally or alternatively, in some embodiments, the one or more heating-sensing elements comprise: a first heating-sensing element configured to heat and determine a temperature of a first zone of a device under test; and a second heating-sensing element configured to heat and determine a temperature of a second zone of the device under test. Additionally or alternatively, in some embodiments, the one or more heating-sensing elements comprise at least one controller that dynamically adjusts one or more properties of the heating mode, the sensing mode, the time period, or a combination thereof based on the determined temperature. Additionally or alternatively, in some embodiments, the one or more heating-sensing circuits are coupled to the one or more heating-sensing elements using 4-wire connections. Additionally or alternatively, in some embodiments, each 4-wire connection comprises wires coupled to 2-wire connections, each 2-wire connection split outside of the respective heating-sensing element. Additionally or alternatively, in some embodiments, each 4-wire connection comprises wires coupled to 2-wire connections, each 2-wire connection split inside of the respective heating-sensing element. Additionally or alternatively, in some embodiments, a zone corresponding to the respective heating-sensing element is smaller than the heating-sensing element. Additionally or alternatively, in some embodiments, the controller is further configured to determine whether one or more criteria have been met, the one or more criteria comprising: the determined temperature of the device under test being greater than a temperature threshold, a power of the device under test being greater than a power threshold, the heating-sensing element being shorted, or the heating-sensing element being an open circuit. Additionally or alternatively, in some embodiments, the one or more heating-sensing circuits comprise: a failsafe circuit configured to, in accordance with meeting the one or more criteria, during the heating mode of the heating-sensing element, prevent the drive voltage circuit from providing power to the heating-sensing element.

It will be appreciated that any of the variations, aspects, features, and options described in view of the systems and methods apply equally to the methods and vice versa. It will also be clear that any one or more of the above variations, aspects, features, and options can be combined. It should be understood that the invention is not limited to the purposes mentioned above, but may also include other purposes, including those that can be recognized by one of ordinary skill in the art.

Figure 1:
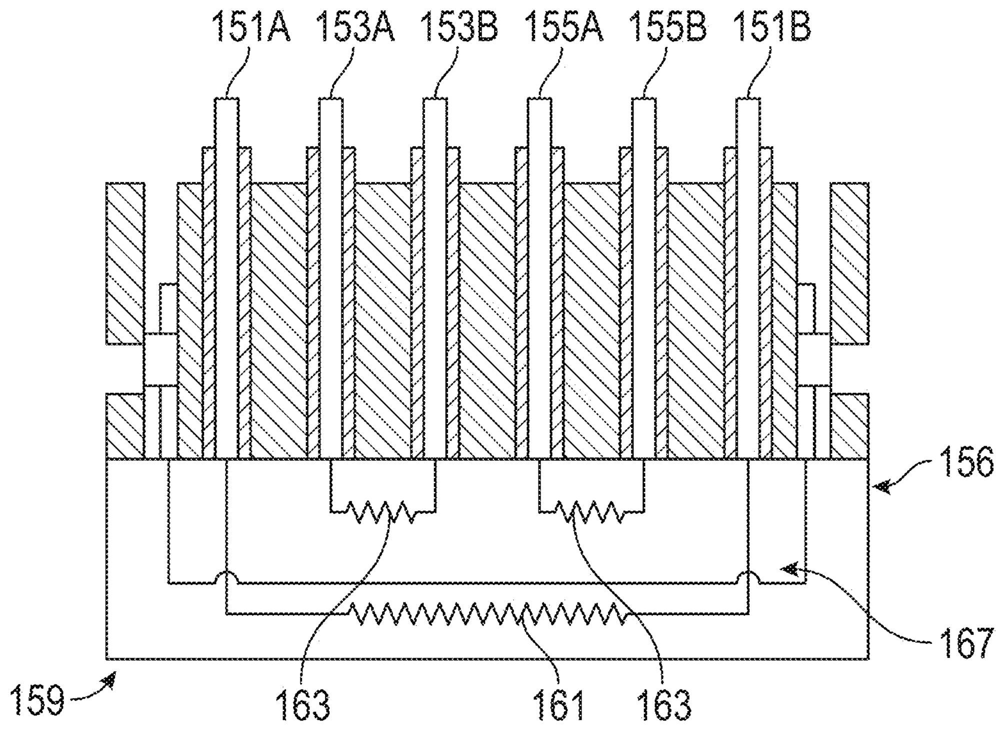
FIG. 1 illustrates a cross-sectional view of an example heater.

It will be appreciated that any of the variations, aspects, features, and options described in view of the systems apply equally to the methods and vice versa. It will also be clear that any one or more of the above variations, aspects, features, and options can be combined.

DETAILED DESCRIPTION

Disclosed herein is an integrated heater and measurement (IHM) device comprising one or more heating-sensing elements. A heating-sensing element may be configured to both generate heat and determine the temperature of the IHM device. In some embodiments, the heating-sensing element may operate in a plurality of modes: heating mode, sensing mode, and/or off mode. A controller may dynamically adjust the properties of the operation mode and/or time periods based on the determined temperature. The adjusted properties may include the duration of the heating mode, the ON time for a heating-sensing element, etc. In some embodiments, the controller may adjust the duration of heating mode based on the temperature difference between the determined temperature and a set point temperature. If there is a low temperature difference, the controller may decrease the duration for the heating mode. If there is a high temperature difference, the controller may increase the duration for the heating mode. If there is little to no temperature difference, the controller may maintain the duration of the heating mode.

In some embodiments, the IHM comprises one or more heating-sensing circuits. A heating-sensing circuit is configured to control the heating-sensing element(s). A heating-sensing circuit may comprise a drive voltage circuit configured to provide power to the heating-sensing element(s) during heating mode, a current circuit configured to send current to the heating-sensing element(s) during sensing mode, a sense voltage circuit configured to determine one or more voltage drops across the heating-sensing element(s), and a controller configured to determine a temperature of the heating-sensing element(s) of the voltage drop(s). In some embodiments, the heating-sensing circuit(s) comprise a fail-safe circuit configured to prevent the drive voltage circuit from providing power to heating-sensing element(s). In some embodiments, the heating-sensing circuit(s) are coupled to the heating-sensing element(s) using 2-wire or 4-wire connections.

The following description is presented to enable a person of ordinary skill in the art to make and use various embodiments. Descriptions of specific devices, techniques, and applications are provided only as examples. These examples are being provided solely to add context and aid in the understanding of the described examples. It will thus be apparent to a person of ordinary skill in the art that the described examples may be practiced without some or all of the specific details. Other applications are possible, such that the following examples should not be taken as limiting. Various modifications in the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown but are to be accorded the scope consistent with the claims.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to a person of ordinary skill in the art, that one or more aspects and/or features described or referenced herein may be practiced without some or all of these specific details. In other instances, well-known process steps and/or structures have not been described in detail in order to not obscure some of the aspects and/or features described or referenced herein.

In the following description of examples, reference is made to the accompanying drawings that form a part hereof, and in which it is shown by way of illustration specific examples that can be practiced. It is to be understood that other examples can be used, and structural changes can be made without departing from the scope of the disclosed examples.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combination of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates a cross-sectional view of an example heater. The heater 156 comprises a plurality of pins, a plurality of heating elements 163, a measurement trace 161, and a shield 167. Some of the plurality of pins 151 (including pins 151A and 151B), 153 (including pins 153A and 153B), and 155 (including pins 155A and 155B) may be pins used to carry electrical current into and out of the heater 156. The plurality of heating elements 163 generate heat for the heater 156. The measurement trace 161 determines the temperature of the surface 159, which contacts a component such as a DUT. As shown in the figure, the measurement trace 161 is located within the body of the heater 156 close to the surface 159. The measurement trace 161 is separate from the heating elements 163 and is coupled to pins 151, separate from the pins 153 and 155 for the heating elements 163. A controller (not shown) is coupled to the pins 151, 153, and 155 so that it can determine the temperature of the heater 156 and adjust it according to the determined temperature.

Figure 2A:
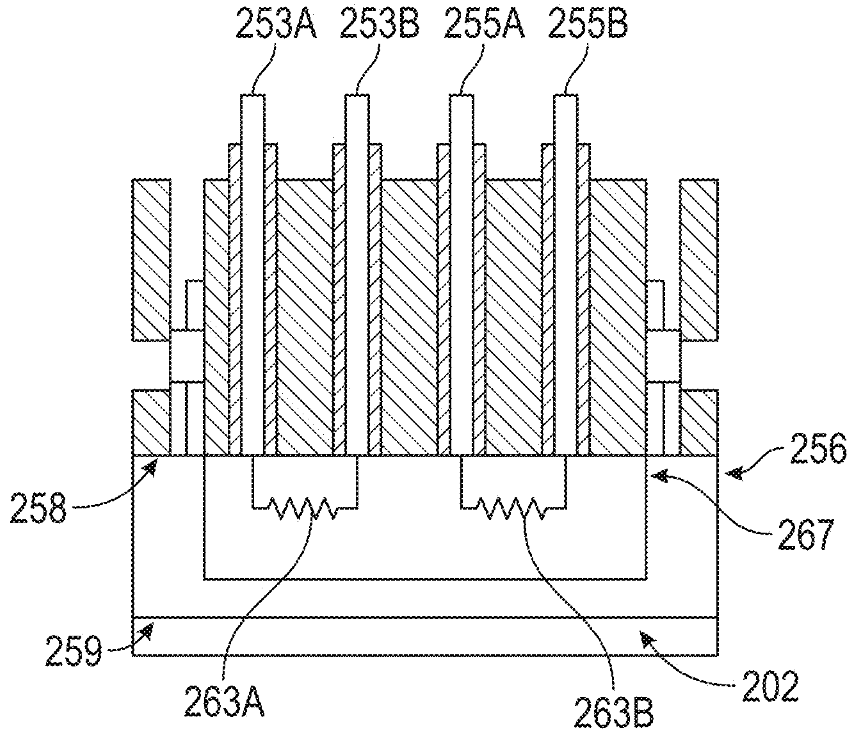
FIG. 2A illustrates a cross-sectional view of an example integrated heater and temperature measurement (IHM) device, according to embodiments of the disclosure.

FIG. 2A illustrates a cross-sectional view of an example integrated heater and temperature measurement (IHM) device, according to embodiments of the disclosure. IHM device 256 comprises a plurality of pins, a plurality of heating-sensing elements 263A and 263B, and a shield 267. The heating-sensing elements 263A and 263B generate heat for IHM device 256. As discussed in more detail below, at least one heating-sensing element 263A or 263B also determines the temperature of the IHM device 256. Heating-sensing element 263A is coupled to pins 253 (including pins 253A and 253B), and heating-sensing element 263B is coupled to pins 255 (including pins 255A and 255B). One or more controllers are coupled to the pins 253 and 255 for operating the heating-sensing elements 263A and 263B for both heating and determining the temperature of the IHM device 256. In the IHM device 256, a separate measurement trace (e.g., measurement trace 161 of FIG. 1) and separate pins are not required for heating and determining the temperature (e.g., pins 153 and 155 for heating, and separate pins 151 for determining the temperature, as shown in FIG. 1). Embodiments of the disclosure comprise a single set of pins for each heating-sensing element 263 (the number of sets of pins is equal to the number of heating-sensing elements) and excludes additional pins for temperature sensing. For example, a set of pins 253A and 253B are coupled to heating-sensing element 263A, and a set of pins 255A and 255B are coupled to heating-sensing element 263B. Heating-sensing element 263A heats and determines the temperature of a first portion (e.g., a first zone) of the IHM device 256, and heating-sensing element 263B heats and determines the temperature of a second portion (e.g., a second zone). As a result, the IHM device 256 is simpler (than, e.g., heater 156 of FIG. 1), leading to better manufacturing yield. The IHM device 256 is also smaller for a given number of heating-sensing elements, allowing a smaller heater or additional pins and/or heating-sensing elements to be included in a single IHM device 256. An IHM device 256 of the embodiments of the disclosure having a certain number of heating-sensing elements 263 has fewer number of pins than a heater that has the same number of heating elements 163. For example, heater 156 of FIG. 1 comprising two heating elements requires six pins, whereas an IHM device 256 comprising the same number of heating-sensing elements 263 requires only four pins. For a test system comprising a large number of heating elements and/or temperature sensors, the number of pins and the resulting interconnect wires may be large, resulting in bulky, costly, and complex heater, thermal head, and test system. With advances in technology resulting in high density and a complex mixture of components, it may be important for the test system to be able to handle thermally controlling components located within close proximity to one another. Thus, bulky, costly, and complex heaters, thermal heads, and test systems may not be suitable.

In some embodiments, the heating-sensing elements 263 comprise resistors and/or resistive traces. Example materials for the heating-sensing elements 263 may include, but are not limited to, tungsten, iron, kovar, moly, palladium, platinum, or a combination thereof. In some embodiments, a heating-sensing element 263 may have a temperature coefficient of resistance (TCR) that is similar to measurement trace 161 of FIG. 1. For example, the heating-sensing element 263 may have a TCR of 0.0031 ppm/° C.±20%. While a low TCR may be better when the heater comprises heating elements separate from the temperature sensor, here, a high TCR for the heating-sensing elements may help detect small changes in temperature. With a high TCR, a large change in resistance may be indicative of a small change in temperature. Thus, the IHM device 256 of the disclosure may be more sensitive than heater 156 (of FIG. 1).

The controller may send one or more signals (e.g., a current or voltage signal) to the pins 253 and 255 to provide power to the heating-sensing elements 263A and 263B. Power applied to the pins 253A and 253B may cause the electrically coupled heating-sensing element 263A to turn on and generate heat, and power applied to the pins 255A and 255B may cause the electrically coupled heating-sensing element 263B to turn on and generate heat. In some embodiments, the IHM device 256 includes a large number of heating-sensing elements 263 to increase the overall power output from the IHM device 256 at a given voltage. For example, an IHM device 256 may comprise five heating-sensing elements 263, each configured to generate 200 W at 200 VDC, thereby generating a total output power of 1000 W. As discussed in more detail below, in some embodiments, the controller determines the resistance of a heating-sensing element 263 and then determines its temperature based on the determined resistance.

In some embodiments, the heating-sensing elements 263A and 263B may be formed on the same layer as each other, as shown in the figure. Alternatively, the heating-sensing elements 263A and 263B are formed on separate layers within the body of the IHM device 256. For example, the heating-sensing elements 263A and 263B may be resistive traces formed on a plurality of layers so that a target resistance within a target area of the IHM device 256 is obtained. In some embodiments, the heating-sensing elements 263A and 263B are located further from a DUT 202 than the shield 267.

Although FIG. 2A illustrates a single row of four pins, embodiments of the disclosure may comprise any configuration and number of pins, such as a single row of pins arranged around the perimeter of the surface of the IHM device 256, two pins in a row on one side of the IHM device 256, 10 or more pins in a row, four pins in two rows on two sides, or the like. In some embodiments, the plurality of pins may occupy less than 10%, 30%, 50%, etc. of the surface of the IHM device 256. In some embodiments, the inner region of the surface 258 of the IHM device 256 may exclude pins to allow the IHM device 256 to make contact with an adapter at the inner region.

Figure 2B:
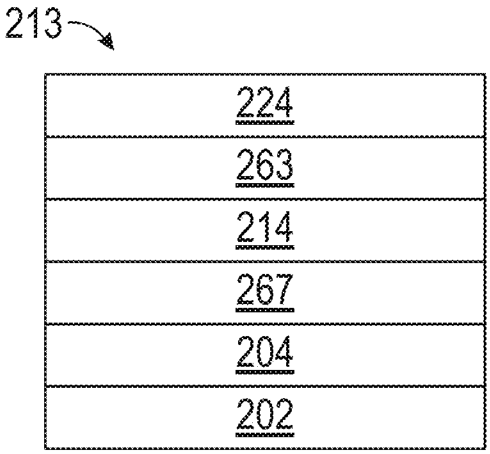
FIG. 2B illustrates an example stackup of an IHM device, according to embodiments of the disclosure.

In some embodiments, the shield 267 is located closer to the DUT 202 than the heating-sensing elements 263, such as shown in the example stackup of FIG. 2B. The stackup 213 comprises (in order): a first layer of insulating material 204 located at the surface 259 of the IHM device 256, a shield 267 disposed on the first layer of insulating material 204, a second layer of insulating material 214 disposed on the shield 267, heating-sensing element(s) 263 disposed on the second layer of insulating material 214, and a third layer of insulating material 224 disposed on the heating-sensing elements 263. In some embodiments, the first layer of insulating material 204 is located between the shield 267 and a DUT 202 (or intermediate layer(s) between the heating-sensing element 263 and the DUT 202). The insulating material of the first layer, second layer, and/or third layer may be a substrate. The substrate may comprise ceramic or aluminum nitride (AlN), for example.

The shield 267 may be grounded, providing an electrical ground path to the IHM device 256 during testing. As discussed in more detail below, during testing, the heating-sensing elements 263 are turned on and off in rapid succession at high voltages and currents, which can generate electrical noise. The electrical noise can interfere with the test system circuitry and/or measurements. The shield 267 reduces or eliminates the unwanted electrical noise.

A test system may comprise one or more thermal heads. Each zone of a thermal head may comprise one or more heating-sensing elements 263. In some embodiments, any number of heating-sensing elements 263 may be associated with a zone, depending on the power requirements of the zone and power limitations of the heating-sensing elements 263. As one non-limiting example, each heating-sensing element 263 heats and senses the temperature of a unique zone. In some embodiments, a first heating-sensing element 263A is independent from a second heating-sensing element 263B, such that heating the first zone (using the first heating-sensing element 263A) does not heat the second zone, and vice versa. Additionally, or alternatively, the temperature and/or resistance determined for the first zone (using the first heating-sensing element 263A) is not affected by the second zone.

The total area of thermal control may be the same or less than (e.g., 20%) the total surface area of the IHM device 256. In some embodiments, the heating-sensing element(s) 263 are located throughout a large percentage (e.g., 80% or more) of the surface of the IHM device 256, or certain zone(s) of the IHM device 256. In some embodiments, different heating-sensing elements 263 may have different properties. For example, one or more first heating-sensing elements 263A is associated with one or more first zones, being high-power heating-sensing elements and high-power zones, respectively, while one or more second heating-sensing elements and second zones are low-power heating-sensing elements and low-power zones, respectively.

Embodiments of the disclosure comprise a heating-sensing element 263 having materials, resistances, and/or TCRs different from another heating-sensing element 263 within a given IHM device 256. In some embodiments, the IHM device 256 comprises one or more insulating mechanisms to insulate two or more heating-sensing elements 263 or zones from each other, or the heating-sensing elements 263 or zones may be spatially separated by a pre-determined distance. One example insulating mechanism comprises through-holes or trenches in the body of the IHM device 256 at location(s) between the heating-sensing elements and edge(s) of the zones. In some embodiments, different heating-sensing elements 263 are associated with different zones.

Figure 3:
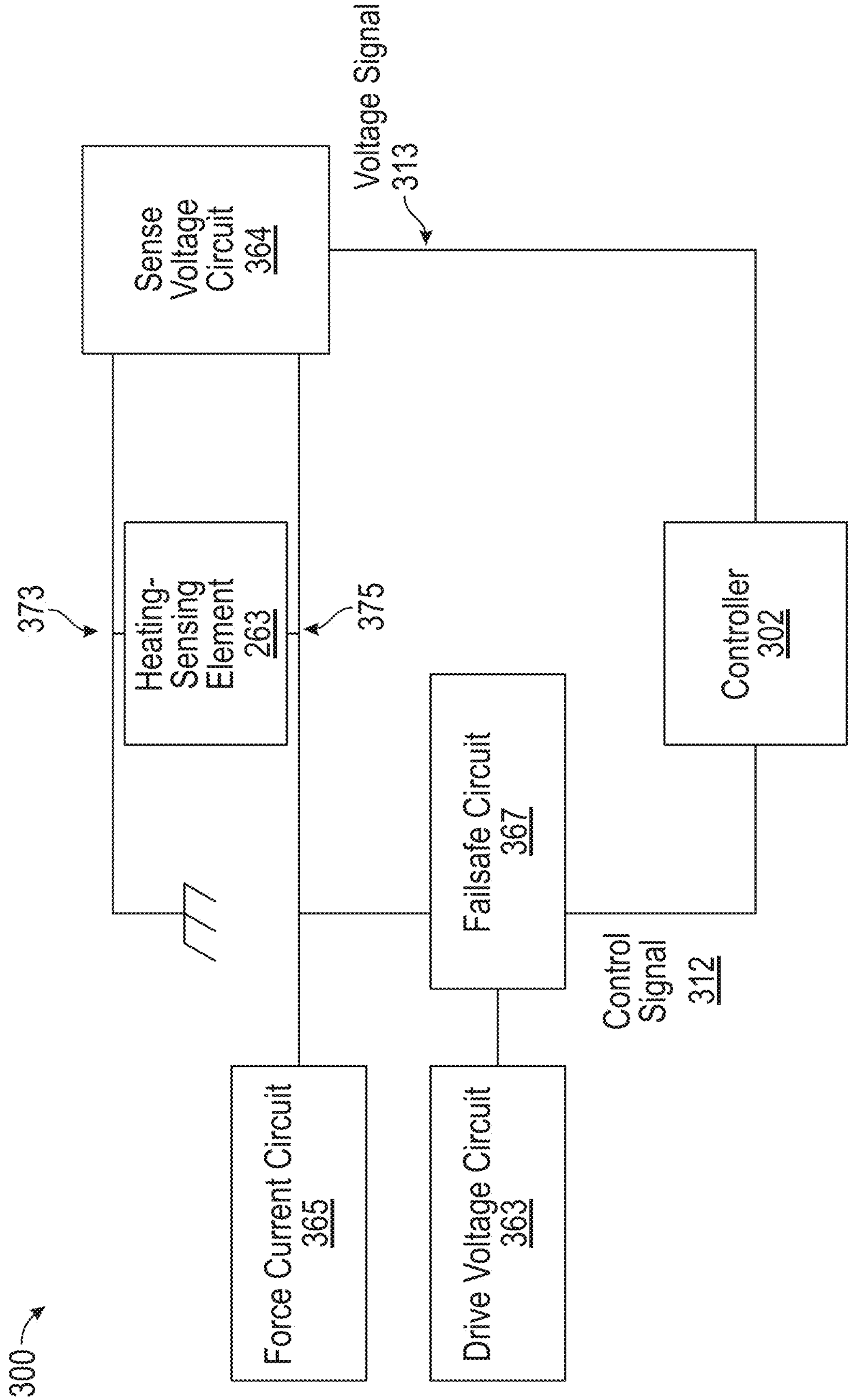
FIG. 3 illustrates a block diagram of an example circuit for a heating-sensing element, according to embodiments of the disclosure.

FIG. 3 illustrates a block diagram of an example circuit for a heating-sensing element, according to embodiments of the disclosure. Heating-sensing circuit 300 comprises a circuit for operating a heating-sensing element 263 in a plurality of operation modes: heating mode, sensing mode, and off mode. Heating-sensing circuit 300 comprises a drive voltage circuit 363, a controller 302, a force current circuit 365, a sense voltage circuit 364, and a failsafe circuit 367. The drive voltage circuit 363 may be coupled to the controller 302, the failsafe circuit 367, and a node 375 of the heating-sensing element 263. The drive voltage circuit 363 receives one or more control signals 312 from the controller 302 and is configured to turn on the heating-sensing element 263, causing it to generate heat during a heating mode. The drive voltage circuit 363 may operate in accordance with the one or more control signals 312, such as turning off the heating-sensing element 263 to prevent it from generating heat (e.g., during sensing or off mode).

The force current circuit 365 may be coupled to the controller 302 and the node 375 of the heating-sensing element 263. The force current circuit 365 provides a current signal to the heating-sensing element 263 during the sensing mode in response to one or more control signals 312 from the controller 302. The current signal from the force current circuit 365 causes a current to flow through the heating-sensing element 263. The sense voltage circuit 364, coupled to both nodes 373 and 375 of the heating-sensing element 263, determines the voltage drop across the nodes 373 and 375 and generates the voltage signal 313 indicative of this voltage drop. The voltage signal 313 is processed (e.g., including converted by an analog-to-digital converter, amplified, etc.) and sent to the controller 302. One skilled in the art would understand the controller may be implemented in hardware or software.

In some embodiments, the heating-sensing circuit 300 comprises a failsafe circuit 367. The failsafe circuit 367 is configured to reduce the likelihood of or prevents one or more heating-sensing elements 263 from overheating and/or failing. In some instances, the heating-sensing element 263 may be inadvertently shorted to ground. With a short to ground, the controller 302 determines the resistance of the heating-sensing element 263 as being lower than its actual resistance. The controller 302 may also determine the temperature of the heating-sensing element 263 is lower than its actual temperature, which may cause the controller 302 to try to increase the power to the heating-sensing element 263 (if without the failsafe circuit 367). Excess power may cause the heating-sensing element 263 to generate too much heat and fail. The failsafe circuit 367 prevents excess power from being sent to the heating-sensing element 263, e.g., during the heating mode. In some embodiments, the failsafe circuit 367 and/or controller 302 may determine that one or more criteria have not been met and prevents the drive voltage circuit 363 from providing a voltage to the heating-sensing element 263. Example criteria including, but are not limited to, the temperature of the DUT being greater than a temperature threshold, the power of the DUT being greater than a power threshold, the heating-sensing element 263 being shorted, or the heating-sensing element 263 being an open circuit. For example, the controller 302 may determine that the criteria has not been met and generates an error in response that is then communicated to the failsafe circuit 367. In some embodiments, the failsafe circuit 367 includes a fuse that fails and/or creates an open circuit when the heating-sensing element 263 is shorted.

The controller 302 determines the temperature of the heating-sensing element 263 based on the voltage signal 313 and the current signal from the force current circuit 365. In some embodiments, the controller 302 comprises an FPGA. Using an FPGA for thermal control may be beneficial due to its accuracy of the time base, or the level of precision due to the frequency used for timing. Any variation in the time base will distort the "D" or derivative term in a PID algorithm and cause errors in thermal control. Furthermore, an FPGA can support very fast floating-point calculations, which may be needed for the control algorithms. Additionally, an FPGA can support high frequencies (e.g., 5 kHz frequency, or in other words, a temperature measurement every 200 μs) for driving one or more control signals to a heating-sensing element 263. A high rate of temperature measurements allows more precise control of the temperature of the heating-sensing elements 263.

In some embodiments, the heating-sensing circuit 300 operates as a feedback loop. The heating-sensing circuit 300 causes the heating-sensing element 263 to generate heat during a heating mode. The heating-sensing circuit 300 also determines the resistance or temperature of the heating-sensing element 263 during a sensing mode. The properties of the heating-sensing circuit 300 during the heating mode is determined and/or dynamically adjusted based on the resistance or temperature determined during the sensing mode. The heating-sensing circuit 300 alternates between the modes. In some embodiments, a time period includes one portion where the heating-sensing circuit 300 operates in the heating mode, one portion where the heating-sensing circuit 300 operates in the sensing mode, and optionally, one portion where the heating-sensing circuit 300 operates in off mode. In the off mode, the heating-sensing element 263 is neither generating heat nor sensing the temperature. In some embodiments, each heating-sensing element 263 is associated with a unique heating-sensing circuit 300.

Figure 4:
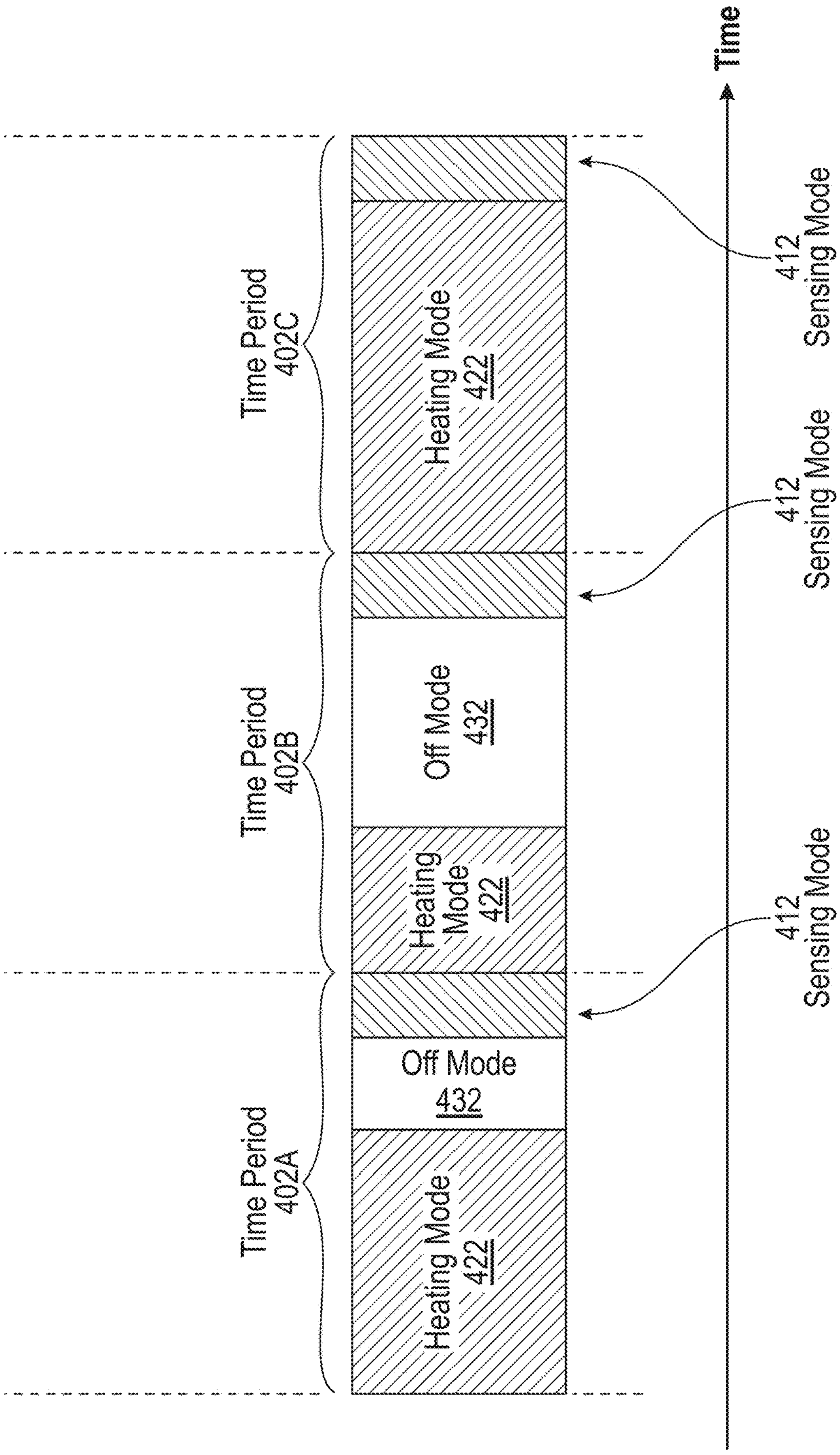
FIG. 4 illustrates example time periods and modes of operation for a heating-sensing element, according to embodiments of the disclosure.

FIG. 4 illustrates example time periods and modes of operation for a heating-sensing element, according to embodiments of the disclosure. The timing diagram of the figure illustrates a plurality of time periods 402. The heating-sensing circuit 300 may operate with one or more of the time periods 402A, 402B, or 402C.

The different time periods 402A, 402B, and 402C shown in FIG. 4 comprise different operation modes, different percentages of the time period for a given operation mode, etc. In some embodiments, the majority of the time period 402A comprises the heating mode 422. For example, the time period 402A may comprise the heating mode 422 during 80% of the time period 402A, off mode 432 for 10%, and sensing mode 412 for 10%. As another example, the time period 402B comprises the heating mode 422 during 40% of the time period 402B, off mode 432 for 50%, and sensing mode 412 for 10%. Time period 402C comprises heating mode 422 during 90% and sensing mode 412 for 10%. In some embodiments, when a time period includes heating mode, off mode, and sensing mode, the off mode is after the heating mode, and the sensing mode is after the off mode.

In some embodiments, the controller 302 dynamically adjusts the properties of the operation mode, such as the heating mode, and/or time periods based on the determined temperature. The duration of the heating mode 422 (or the percentage the heating mode 422 occupies the time period 402) may be varied and adjusted dynamically (e.g., changed in real-time) based on, e.g., the temperature difference between the measured temperature and the set point temperature. If the temperature difference is greater than a difference threshold (e.g., there is a large difference between the measured temperature and the set point temperature), then the controller 302 turns on the heating-sensing element 263 in heating mode 422.

If the temperature difference is within a range of the difference threshold (e.g., the measured temperature is close to the set point temperature), then the controller 302 determines an ON time for the heating-sensing element 263, where the ON time may be the time required for maintaining the temperature of the heating-sensing element 263. In some embodiments, the controller 302 determines the ON time based on a PID (proportional, integral, derivative) control algorithm. For example, the temperature (determined during sensing mode) of a heating-sensing element 263 may be lower than the set point temperature by a certain (first) temperature difference. The controller 302 sets or adjusts the duration of the heating mode based on the first temperature difference. If the temperature of the heating-sensing element 263 then has a different, second temperature difference, the controller 302 adjusts the duration of the heating mode in accordance with the second temperature difference. In one non-limiting instance, the second (low) temperature difference is lower than the first (high) temperature difference, so the controller 302 decreases the duration that the heating-sensing element 263 is generating heat as the amount of heat to be generated is lower. When there is a high temperature difference between the determined temperature and the set point temperature, the controller 302 increases the duration that the heating-sensing element 263 is generating heat (duration of the heating mode) as the amount of heat to be generated is higher. For example, the heating-sensing circuit 300 operates according to time period 402C when the temperature difference is high, time period 402B when the temperature difference is low, and time period 402A when the temperature difference is in between. In some embodiments, the controller 302 is configured to maintain the temperature of the heating-sensing element 263 for one or more time periods. In some embodiments, the controller 302 maintains the durations and/or percentages of the operating modes while there is a zero-temperature difference.

During heating mode 422, the heating-sensing element 263 may operate by modulating the ON pulse. In some embodiments, the duty cycle of the ON pulse may be based on the temperature difference between the measured temperature and set point temperature, or whether the measured temperature is greater than or less than the set point temperature. For example, the duty cycle of the ON pulse may be 90% when the measured temperature is less than the set point temperature (so that the heating-sensing element 263 can quickly heat up the DUT). As another example, the duty cycle of the ON pulse may be 0% when the measured temperature is greater than the set point temperature (so that the heating-sensing element 263 can allow a cold plate to cool down the DUT).

In some embodiments, time period 402C may not include the off mode 432. During the off mode 432, in some embodiments, the drive voltage circuit 363, the force current circuit 365, and the sense voltage circuit 364 are off. In some embodiments, the duration of the sensing mode 412 is predetermined. The controller 302 determines the different operation modes and/or percentages of a time period for a given operation mode.

In some embodiments, an IHM device 256 and/or test system comprises a plurality of heating-sensing elements 263 and a plurality of heating-sensing circuit 300. For example, an IHM device 256 comprises 16 heating-sensing elements 263 and 16 heating-sensing circuits 300. When operating a heating-sensing element 263 in off mode 432 and/or sensing mode 412, in some embodiments, other heating-sensing elements 263 (e.g., the remaining 15 (of the 16) heating-sensing elements 263) are also operated in the same mode. Operating a plurality (e.g., all) of the heating-sensing elements 263 in the same IHM device 256 in the same mode (sensing mode, off mode, etc.) at the same time may help reduce or eliminate noise that comes from, e.g., switching of the heating-sensing circuits 300.

In some embodiments, the voltage measured by the sense voltage circuit 364 is sensitive to noise in the heating-sensing circuit 300. This noise may interfere with the accuracy of the determined resistance and/or temperature. This is particularly problematic for high-voltage heaters (e.g., greater than 200 V, such as 240 V) that create a large EMI event when turned on and/or when fine temperature control is required. For example, some applications want or require the sense voltage circuit 364 be capable of measuring single-digit mV changes. To mitigate potential noise from heater switching, embodiments of the disclosure comprise measuring the temperature of the heating-sensing element 263 in the sensing mode during different portions of a time period than the heating mode. A time period 402 may comprise a plurality of operating modes for the heating-sensing element 263. In some embodiments, a time period 402 may be determined based on the frequency of the temperature measurements. For example, the IHM device 256 of the disclosure may measure the temperature of a heating-sensing element every 200 μs, and a time period may be 200 μs.

Figure 5A:
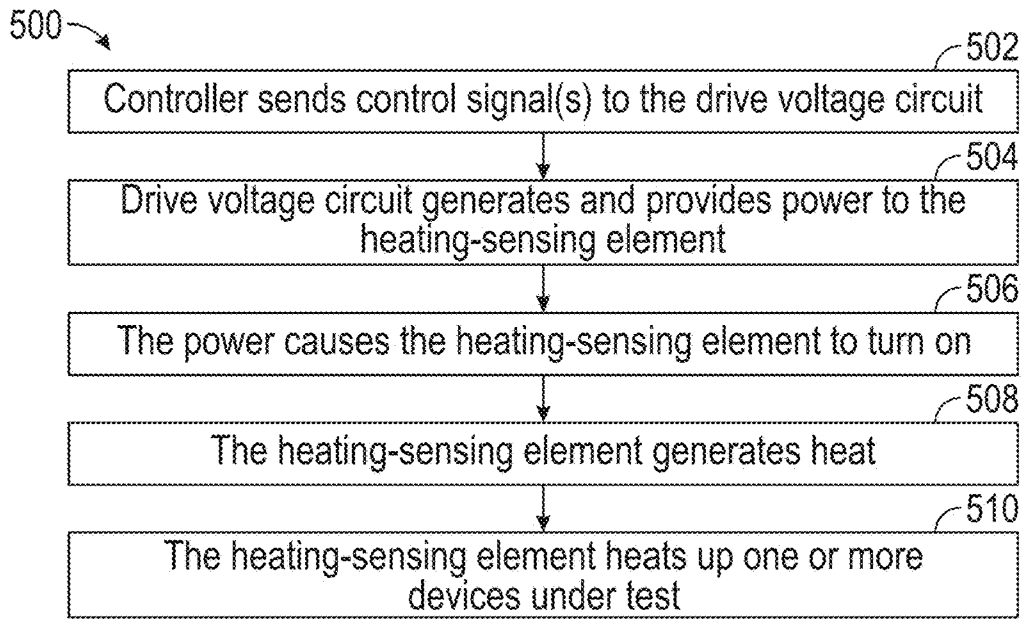
FIG. 5A illustrates an example method for heating using a heating-sensing element in a heating mode, according to embodiments of the disclosure.

Embodiments of the disclosure comprise a method for controlling a temperature of DUT. FIG. 5A illustrates an example method for using a heating-sensing element in a heating mode, according to embodiments of the disclosure. To cause a heating-sensing element 263 to heat, the controller 302 sends one or more control signals 312 to the drive voltage circuit 363 (step 502 of method 500). The drive voltage circuit 363 generates and provides power to the heating-sensing element 263 (step 504). The power causes the heating-sensing element 263 to turn on (step 506). In some embodiments, the amount of power may be based on the duty cycle of the ON pulse of the heating-sensing element 263. In step 508, the heating-sensing element 263 then generates heat, where the amount of heat generated is related to the power applied by the drive voltage circuit 363. One or more devices under test 202 are thermally coupled to the IHM device 256, so the heating-sensing element 263 of the IHM device 256 heats up the one or more devices under test 202 (step 510).

Figure 5B:
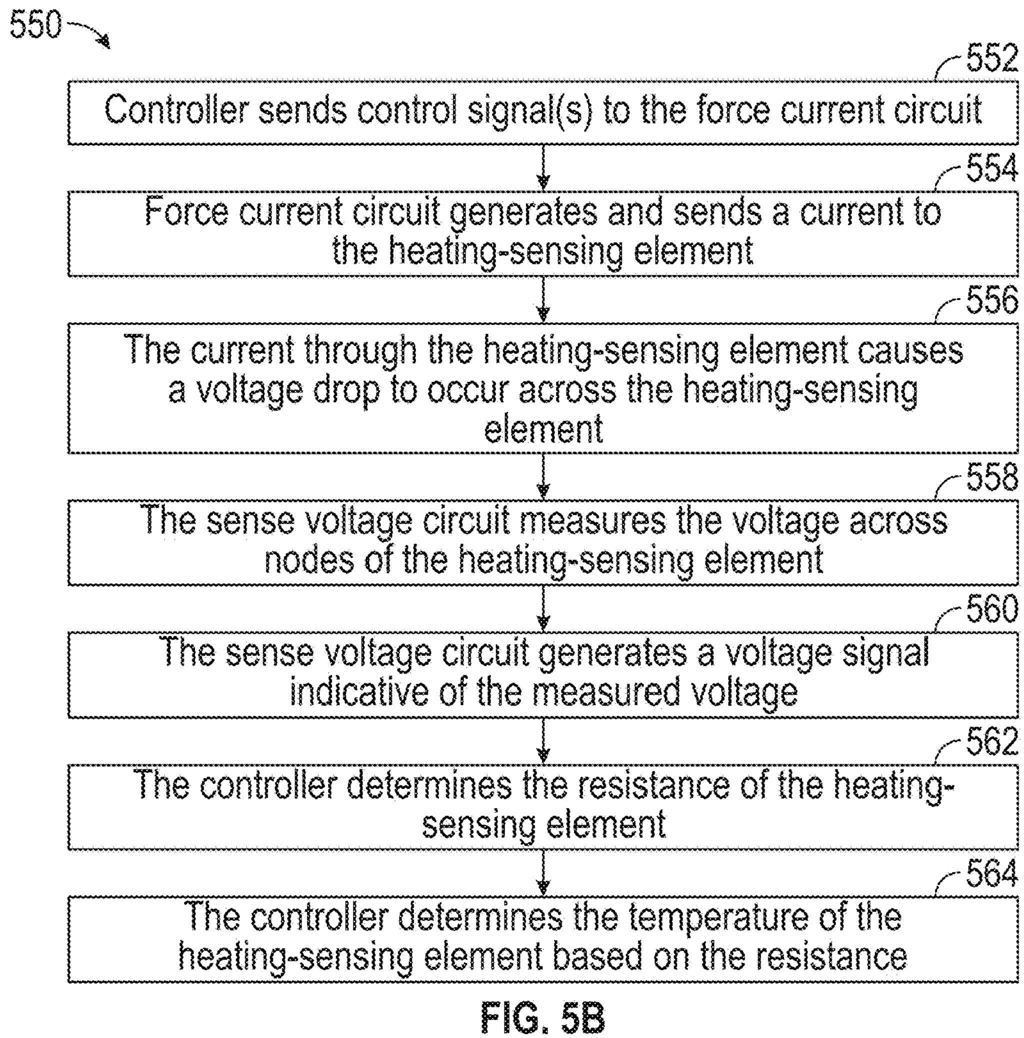
FIG. 5B illustrates an example method for determining the temperature of a heating-sensing element in a sensing mode, according to embodiments of the disclosure.

FIG. 5B illustrates an example method for determining the temperature of a heating-sensing element in a sensing mode, according to embodiments of the disclosure. Method 550 comprises step 552, where the controller 302 sends one or more control signals 312 to a current circuit (e.g., force current circuit 365). In step 554, the force current circuit 365 generates and sends a current (such as a fixed force current) to the heating-sensing element 263. In some embodiments, the force current circuit 365 sends a fixed force current to the node 375 of the heating-sensing element 263. The current through the heating-sensing element 263 causes a voltage drop to occur across the heating-sensing element 263 (step 556). In step 558, a sense circuit (e.g., sense voltage circuit 364) determines the voltage (e.g., voltage drop) across the nodes 373 and 375 of the heating-sensing element 263. The sense voltage circuit 364 generates a voltage signal 313 indicative of the measured voltage (step 560). The voltage signal 313 is then output to the controller 302. In step 562, the controller 302 receives the voltage signal 313 and determines the resistance of the heating-sensing element 263. In some embodiments, the resistance of the heating-sensing element 263 is determined based on the measured voltage (from the sense voltage circuit 364) and the generated current (from the force current circuit 365). In some embodiments, in step 564, the controller 302 determines the temperature of the heating-sensing element 263 based on its resistance. In some embodiments, step 563 comprises using resistance-temperature relationships, which may be determined or adjusted based on calibration information.

In some embodiments, the calibration information is determined after manufacturing the IHM device 256. A plurality of resistances of a heating-sensing element 263 is measured at different temperatures to generate pre-determined calibration information such as a calibration curve, a calibration table, or associated relationships between resistance and temperature. Embodiments of the disclosure comprise a plurality of calibration data including, but not limited to, heating-sensing element calibration data and printed circuit assembly calibration data. The heating-sensing element calibration data may be stored in, e.g., a non-volatile memory chip, or coded into a 1D or 2D code (e.g., a standard barcode or 2D matrix barcode) or a remote database. In some embodiments, a printed circuit assembly (PCA) is associated with the IHM device 256. The PCA may have certain properties and relationships with respect to temperature. The PCA may have its own set of calibration data different from the heating-sensing element calibration data. The PCA calibration data can be stored in a non-volatile memory chip or coded into a 1D or 2D code or a remote database. The controller 302 can use the pre-determined calibration information to determine the measured temperature of the IHM device 256 or temperatures of one or more zones of the IHM device 256. Based on the determined temperature(s), the controller 302 controls one or more heating-sensing elements 263 accordingly.

In some embodiments, at power-up of the test system, the controller 302 reads the associated heating-sensing element calibration data for a heating-sensing element 263 from non-volatile memory. The controller 302 combines the heating-sensing element calibration data with the PCA calibration data to generate a resistance-temperature relationship for a given heating-sensing element and PCA combination. As one non-limiting example, the resistance-temperature relationship comprises a linear relationship. For example, this resistance-temperature relationship may be in the form of a slope with an offset correction.

Figure 6A:
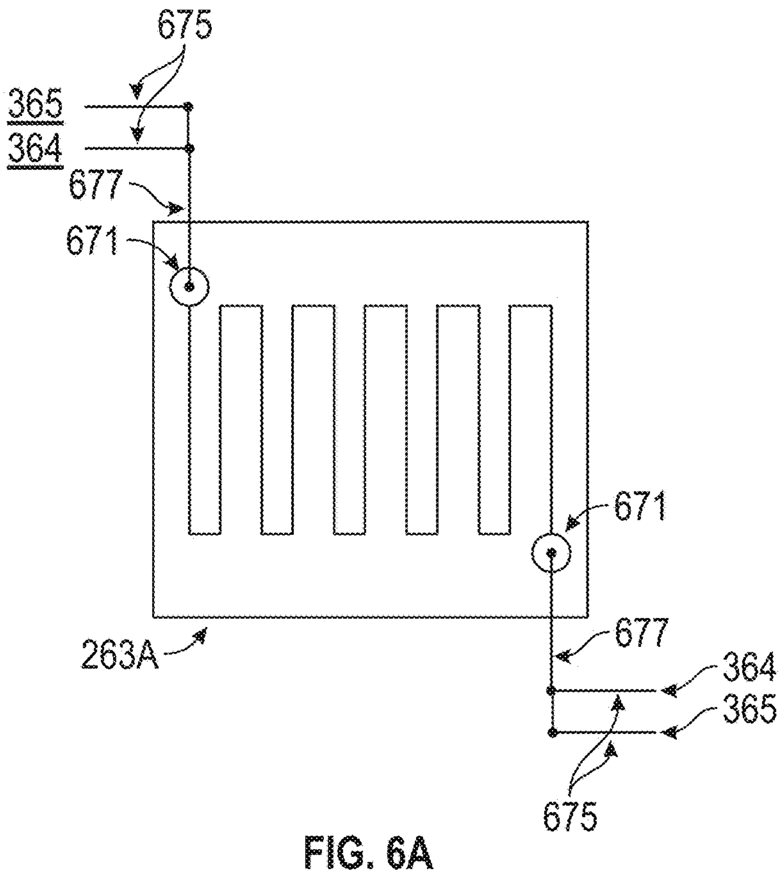
FIGS. 6A and 6B illustrate block diagrams of example 4-wire connections for coupling a heating-sensing circuit to a heating-sensing element, according to embodiments of the disclosure.

In some instances, there may be changes over time in the current and resistance characteristics of the connections between a heating-sensing element 263 and its associated heating-sensing circuit 300. These changes can lead to extraneous temperature measurement errors. Embodiments of the disclosure comprise a 4-wire connection that eliminates temperature measurement errors due to resistance variations in the current sense path. FIG. 6A illustrates a block diagram of an example 4-wire connection for coupling a heating-sensing circuit 300 to a heating-sensing element 263, according to embodiments of the disclosure. The heating-sensing element 263A is coupled to the pins 253A and 253B (of FIG. 2A), which may comprise 2-wire connections, for example. In some embodiments, a 4-wire connection is formed by coupling wires 677 to 2-wire connections at pads 671, and then the splitting each connection to form wires 675. In some embodiments, the connections are split outside of the heating-sensing element 263A. The wires 675 and 677 provide electrical connections between the heating-sensing element 263A and the force current circuit 365, and the heating-sensing element 263A and the sense voltage circuit 364. In some embodiments, the wires 677 are coupled to the pads 671 via soldered connections. There may be little to no current on the connections to the sense voltage circuit 364, thereby resulting in little to no drop in current-resistance and allowing a stable voltage measurement to be taken.

Figure 6B:
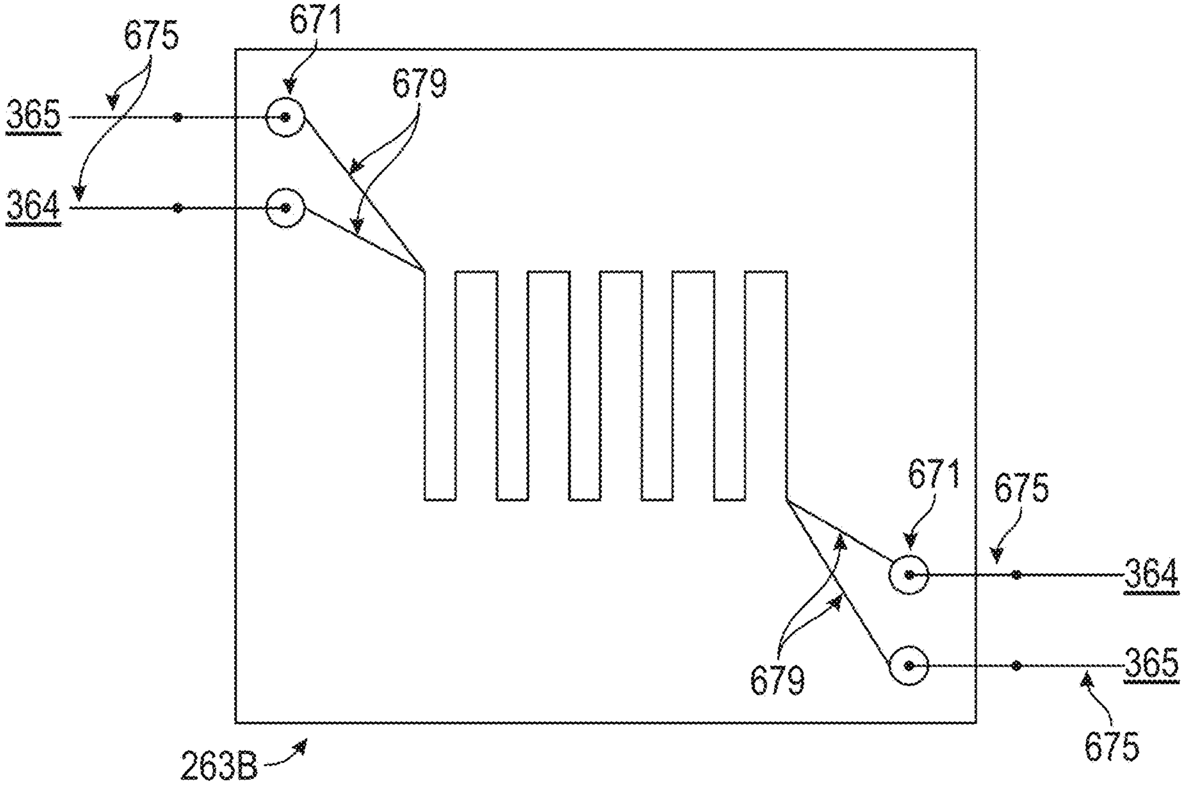

In some embodiments, each 2-wire connection is split inside heating-sensing element 263B, as shown in FIG. 6B. The wires 675 are connected to pads 671 inside the heating-sensing element 263B. In such an instance, the heating-sensing element 263B is coupled to four pins (e.g., pins 253A, 253B, 255A, and 255B of FIG. 2A) for electrically coupling to the force current circuit 365 and the sense voltage circuit 364. In some embodiments, a 4-wire connection is formed by coupling wires 679 to 4-wire connections at pads 671. In some embodiments, the connection between the force current circuit 365 and a corresponding pad 671 comprises a low resistance (mΩ or μΩ) such that the heat generated by the connection is minimized. This may be the case, for example, when the force current is large (around 1 A). In some embodiments, the resistance for the connection between the force current circuit 365 and a corresponding pad 671 is lower than the resistance for the connection between the sense voltage circuit 364 and a corresponding pad 671. A high resistance for the connection between the sense voltage circuit 364 and a corresponding pad 671 may be tolerated because the resistance does not affect the sensed voltage or create unwanted heat. Although the number of pads 671 may be greater for a 4-wire connection having internal split connections, the example 4-wire connection with internal split connections may be suitable when the corresponding zone is smaller than a heating-sensing element 263B, for example, as shown in the figure.

Figure 7:
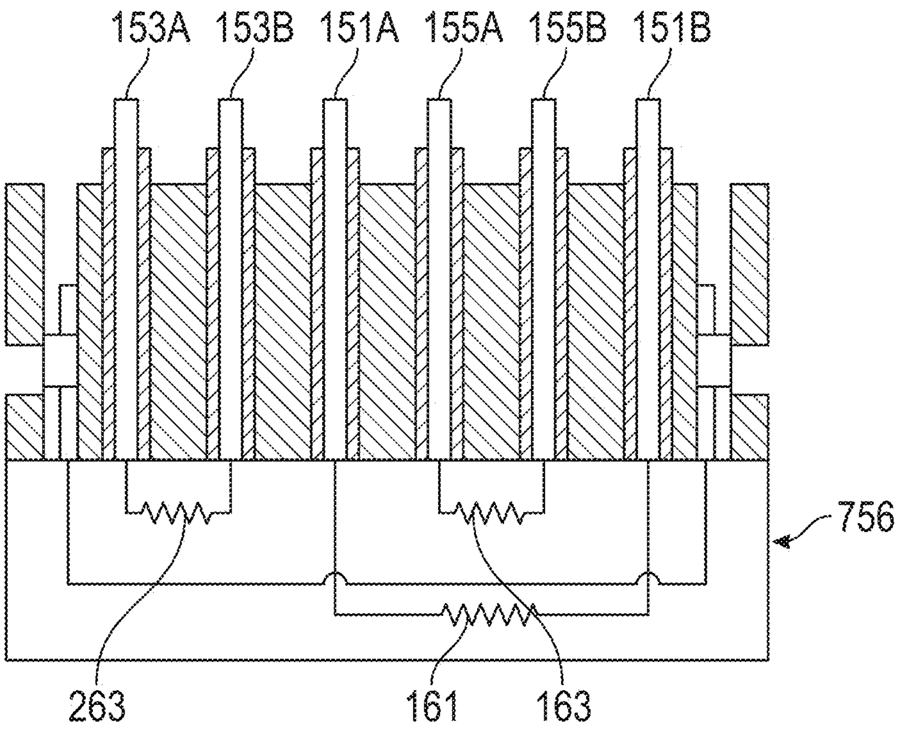
FIG. 7 illustrates a block diagram of an example heater, according to embodiments of the disclosure.

Embodiments of the disclosure include a heater comprising one or more heating-sensing elements, one or more heating elements, and one or more measurement traces. FIG. 7 illustrates a block diagram of an example heater, according to embodiments of the disclosure. Heater 756 comprises heating-sensing element 263, heating element 163, and measurement trace 161. The heating-sensing element 263 is configured for heating and measuring the temperature. The heating element 163 is configured for heating, and the measurement trace 161 is configured of measuring the temperature of the heating element 163. The heating-sensing element 263 is coupled to pins 153A and 153B. The heating element 163 is coupled to pins 155A and 155B, and the measurement trace 161 is coupled to pins 151A and 151B.

EXAMPLE CONTROLLER

Figure 8:
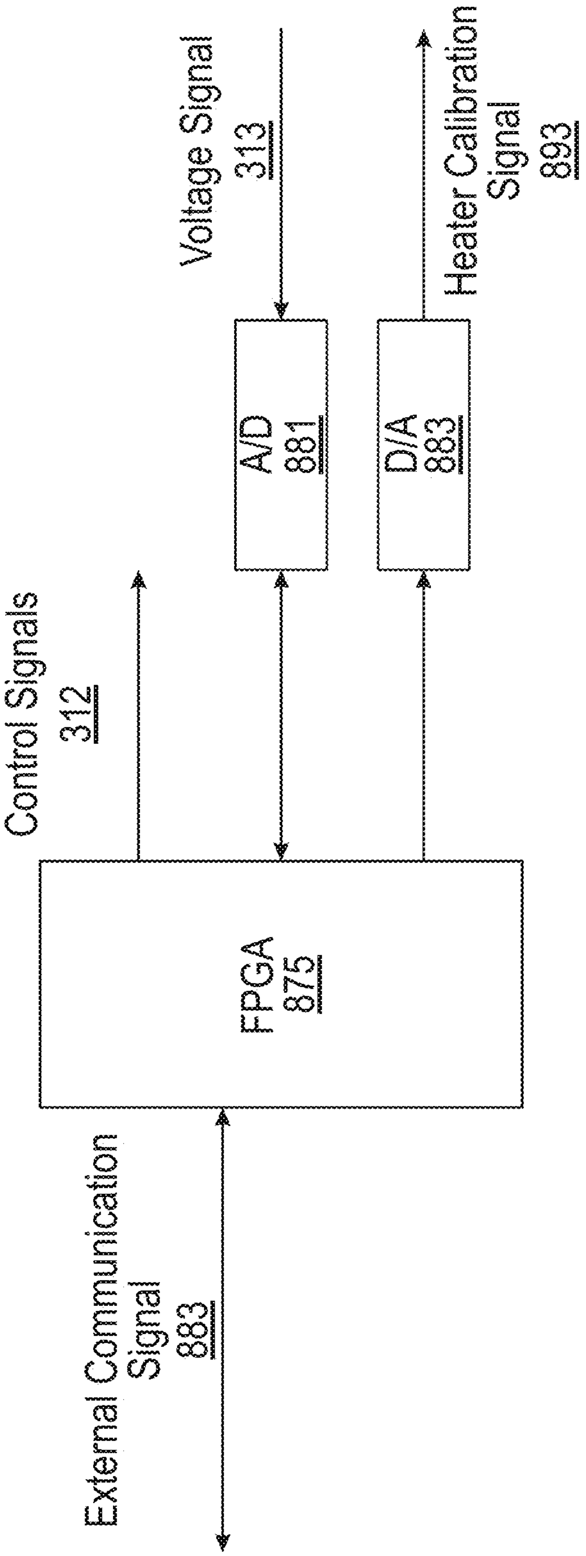
FIG. 8 illustrates a block diagram of an example controller, according to embodiments of the disclosure.

FIG. 8 illustrates a block diagram of an example controller 302, according to embodiments of the disclosure. Controller 302 comprises one or more components, such as (but not limited to) an FPGA 875 (or the like), A/D converter 881, and D/A converter 883. The FPGA 875 may output one or more signals to D/A converter 883, which then converts the signal to a heater calibration signal 893 used to calibrate the heating-sensing element 263 (as discussed above). The heater calibration signal 893 may comprise calibration information, and in some embodiments, the calibration information may be used by the controller 302 to determine the measured temperature of the IHM device 256.

The A/D converter 881 converts the voltage signal 313, and then outputs the converted signal to FGPA 875. The voltage signal 313 may be indicative of a voltage drop across nodes of the heating-sensing element 263. The voltage signal 313 may be used to determine the measured temperature of the IHM device 256.

Additionally, FPGA 875 outputs one or more control signals 312 to control the drive voltage circuit 363 for generating and providing power to the heating-sensing element 263 (as discussed above). In some embodiments, the FPGA 875 may send and/or receive external communication signals 883 to a controller (e.g., a higher level system controller 902 of FIG. 9).

EXAMPLE COMPUTING SYSTEM

Figure 9:
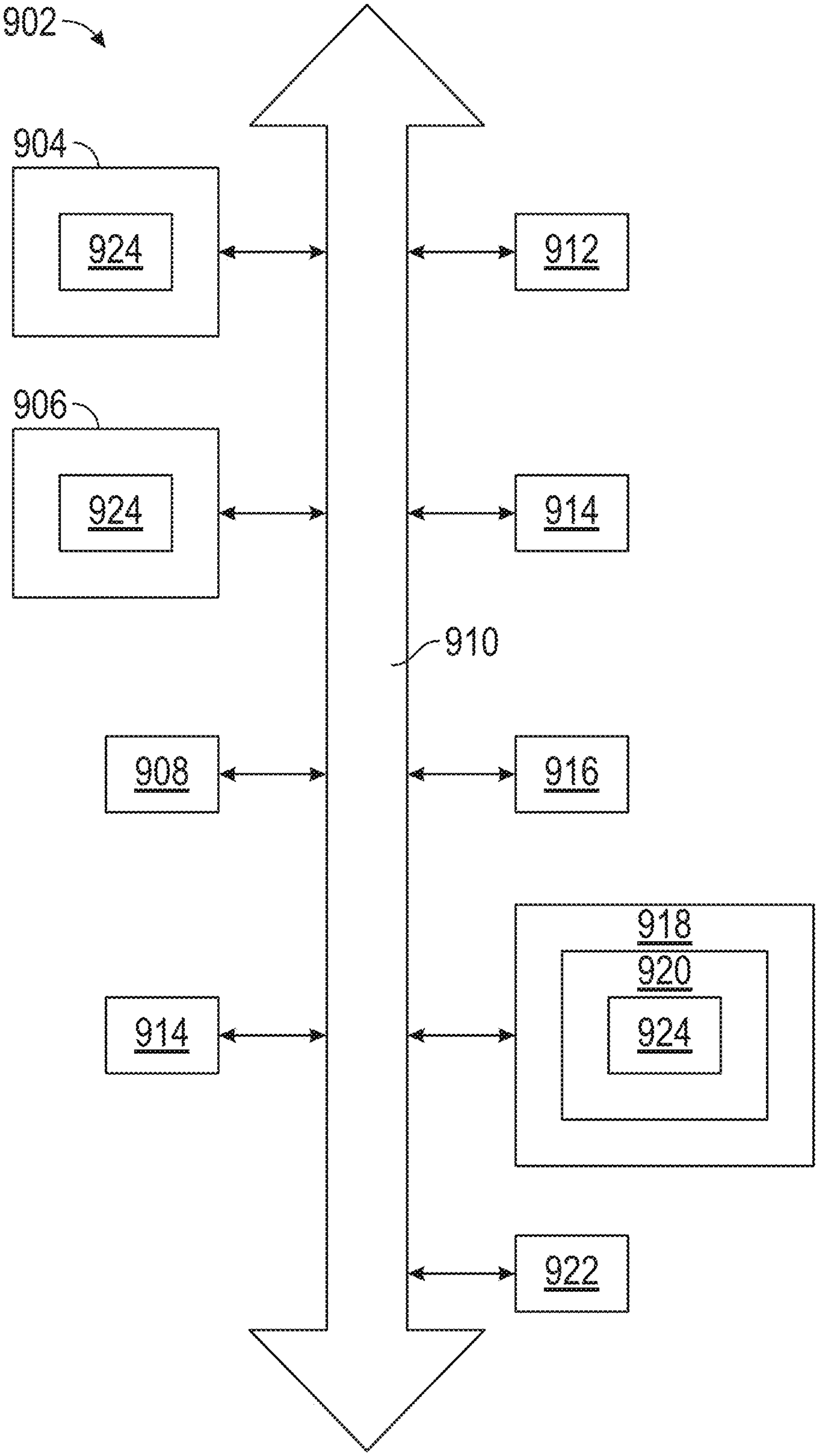
FIG. 9 illustrates a block diagram of an example computer used for one or more controllers, according to embodiments of the disclosure.

FIG. 9 illustrates a block diagram of an exemplary computer 902 that may be used in connection with the disclosed heating and temperature measurement system, according to embodiments of the disclosure. The computer may be a machine, within which a set of instructions, causes the machine to perform any one of the methodologies discussed herein, may be executed, according to embodiments of the disclosure. In some embodiments, the machine can operate as a standalone device or may be connected (e.g., networked) to other machines. In a networked configuration, the machine may operate in the capacity of a server or a client machine in a server-client network environment, or as a peer machine in a peer-to-peer (or distributed) network environment. The machine can be a personal computer (PC), a tablet PC, a set-top box (STB), a personal digital assistant (PDA), a cellular telephone, a web appliance, a network router, a switch or bridge, or any machine capable of executing a set of instructions (sequential or otherwise) that specify actions to be taken by that machine. A mobile device may include an antenna, a chip for sending and receiving radio frequency transmissions and wireless communications, and a keyboard. Further, while only a single machine is illustrated, the term "machine" shall also be taken to include any collection of machines that individually or jointly execute a set (or multiple sets) of instructions to perform any one of the methodologies discussed herein.

The exemplary computer 902 includes a processor 904 (e.g., a central processing unit (CPU), a graphics processing unit (GPU), or both), a memory 906 (e.g., read-only memory (ROM), flash memory, dynamic random access memory (DRAM) such as synchronous DRAM (SDRAM), etc.), and a static memory 908 (e.g., static random access memory (SRAM), etc.), which can communicate with each other via a bus 910.

The computer 902 may further include a video display 912 (e.g., a liquid crystal display (LCD) or light emitting diode (LED) display). The computer 902 also includes an alpha-numeric input device 914 (e.g., a keyboard), a cursor control device 916 (e.g., a mouse), a disk drive unit 918, a signal generation device, a network interface device 922, and one or more wireless interface devices.

The computer 902 may also include other inputs and outputs, including digital I/O and/or analog I/O. For example, the inputs and outputs may communicate with external devices, such as chillers, pressure controllers, force controllers, flow value controllers, etc., using any type of communication protocol.

The drive unit 918 includes a machine-readable medium 920 on which is stored one or more sets of instructions 924 (e.g., software) embodying any one or more of the methodologies or functions described herein. The software may also reside, completely or at least partially, within the main memory 906 and/or within the processor 904 during execution thereof by the computer 902, the main memory 906 and the processor 904 also constituting machine-readable media. The software may further be transmitted or received over a network via the network interface device 922 and/or a wireless device.

While the machine-readable medium 920 is shown in an exemplary embodiment to be a single medium, the term "machine-readable medium" should be taken to include a single medium or multiple media (e.g., a centralized or distributed database and/or associated caches and servers) that store the one or more sets of instructions. The term "machine-readable medium" shall also be taken to include any medium that is capable of storing, encoding, or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. An integrated heater and temperature measurement (IHM) device, comprising:
- a first heating-sensing element coupled to first set of pins and configured to:
  - generate heat; and
  - determine a first temperature of the first heating-sensing element; and
- a second heating-sensing element coupled to second set of pins configured to:
  - generate heat; and
  - determine a second temperature of the second heating-sensing element,
  - wherein the IHM device is for integrated circuit testing or manufacturing.

2. The IHM device of claim 1, wherein the first heating-sensing element and the second heating-sensing element are formed on the same layer of the IHM device.

3. The IHM device of claim 1, wherein the first heating-sensing element and the second heating-sensing element are formed on different layers of the IHM device.

4. The IHM device of claim 1, wherein a number of sets of pins is the same as a number of heating-sensing elements.

5. The IHM device of claim 1, comprising pins arranged around a perimeter of a surface of the IHM device.

6. The IHM device of claim 1, comprising an inner region of a surface, wherein the inner region is configured to make contact with an adapter.

7. The IHM device of claim 1, wherein the first heating-sensing element and the second heating-sensing element determine temperatures for different zones of the IHM device.

8. The IHM device of claim 1, wherein the first heating-sensing element or the second heating-sensing element comprises a resistor or a resistive trace.

9. The IHM device of claim 1, wherein the first heating-sensing element or the second heating-sensing element comprises one or more of: tungsten, iron, kovar, moly, palladium, platinum, or a combination thereof.

10. The IHM device of claim 1, comprising a stackup, wherein the stackup comprises a plurality of insulating materials.

11. The IHM device of claim 10, wherein the plurality of insulating materials comprises a first layer of insulating material, and the stackup comprises a conductive shield disposed on the first layer of insulating material.

12. The IHM device of claim 11, wherein the first layer of insulating material is located at a surface of the IHM device, wherein the plurality of insulating materials comprises a second layer of insulating material disposed on the conductive shield.

13. The IHM device of claim 10, wherein the plurality of insulating materials comprises a first layer of insulating material, the first layer of insulating material comprises aluminum nitride (AlN).

14. The IHM device of claim 10, wherein the plurality of insulating materials comprises a second layer of insulating material, and the first heating-sensing element or the second heating-sensing element is disposed on the second layer of insulating material.

15. The IHM device of claim 10, wherein the plurality of insulating materials comprises a third layer of insulating material disposed on the first heating-sensing element or the second heating-sensing element.

16. The IHM device of claim 1, wherein the first heating-sensing element is a high-power heating sensing element configured to heat and determine a temperature of a high-power zone, and the second heating-sensing element is a low-power heating sensing element configured to heat and determine a temperature of a low-power zone.

17. The IHM device of claim 1, comprising an insulating mechanism configured to thermally insulate the first heating-sensing element and the second heating-sensing element from each other.

18. The IHM device of claim 1, wherein the first heating-sensing element is configured to generate heat and determine a temperature of a first zone, and the second heating-sensing element is configured to generate heat and determine a temperature of a second zone, the IHM device comprising a thermally insulating mechanism configured to insulate the first zone and the second zone from each other.

19. The IHM device of claim 1, wherein the first heating-sensing element is coupled to a first heating-sensing circuit and the second heating-sensing element is coupled to a second heating-sensing circuit.

20. The IHM device of claim 19, wherein the first heating-sensing element is coupled to the first heating-sensing circuit using a 2-wire or 4-wire connection, or the second heating-sensing element is coupled to the second heating-sensing circuit using a 2-wire or 4-wire connection.

* * * * *